(12) United States Patent
Tsai

(10) Patent No.: US 7,034,384 B2
(45) Date of Patent: Apr. 25, 2006

(54) INTEGRATED CIRCUIT ADAPTED FOR ECO AND FIB DEBUG

(75) Inventor: Yu-Wen Tsai, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 171 days.

(21) Appl. No.: 10/824,267

(22) Filed: Apr. 13, 2004

(65) Prior Publication Data

US 2005/0224950 A1    Oct. 13, 2005

(51) Int. Cl.
*H01L 23/02* (2006.01)
(52) U.S. Cl. ........................ 257/678; 257/758
(58) Field of Classification Search ................ 257/678, 257/774, 776, 758, 48
See application file for complete search history.

(56) References Cited

U.S. PATENT DOCUMENTS 4,609,809 A * 9/1986 Yamaguchi et al. ... 219/121.35
6,255,845 B1 * 7/2001 Wong et al. .................. 326/38

* cited by examiner

*Primary Examiner*—Roy Potter
(74) *Attorney, Agent, or Firm*—Winston Hsu

(57) ABSTRACT

An integrated circuit adapted for ECO and FIB debug comprises: a substrate, a spare cell, a top-layer output terminal pad and a top-layer output terminal pad. The spare cell is disposed in substrate and comprises at least one input terminal and at least one output terminal. The top-layer output terminal pad and the top-layer input terminal pad are disposed in a top metal layer. The top metal layer is disposed over the substrate. The top-layer output terminal pad and the top-layer input terminal pad are electrically coupled to the output terminal and input terminal of the spare cell by a via structure, respectively.

11 Claims, 5 Drawing Sheets

INTEGRATED CIRCUIT ADAPTED FOR ECO AND FIB DEBUG

BACKGROUND OF THE INVENTION

1. Field of the Invention

The present invention relates to an integrated circuit, and more particularly to an integrated circuit adapted for ECO and FIB debug.

2. Description of Related Art

During the development of electronic circuits, designers usually perform continuous tests, debugs and revision (including adding/removing devices and cutting/connecting conductive wires) for samples designed thereby. During development of printed circuit boards (PCB), designers can easily and properly modify the circuits (including adding devices or cutting/connecting conductive wires). Compared with PCB, devices cannot be added into integrated circuits after the fabrication thereof are complete. Therefore, integrated circuit designers put spare cells or spare gates in pre-determined area of the integrated circuit layouts for Engineering Change Order (ECO) revision. The spare cell has preset electrical function or logic function. The input terminal and the output terminal of the spare cell do not contact with other cells for the purpose of circuit debug/revision.

A prior art related to this field is U.S. Pat. No. 6,404,226 B1. FIG. 1A is a drawing showing a prior art spare cell of an integrated circuit. As shown in FIG. 1A, the surface of the substrate 110 comprises cells 120, 130 and 140. The cells 130 and 140 are standard cells; the cell 120 is a spare cell. A first metal layer, a second metal layer, a third metal layer and a fourth metal layer are formed over the substrate 110, wherein it is assumed that the fourth metal layer is the top metal layer. M1, M2, M3 and M4 represent the terminal pads or wires of the first metal layer, the second metal layer, the third metal layer and the fourth metal layer. The metal layers are electrically connected by vias, such as via 150 shown in this figure. The structure electrically connecting the metal layers by vias is called a via structure. The signal to be processed, for example, goes into the input terminal of the spare cell 130 through the via structure from the conductive wire 101 of the first metal layer. After the signal is processed by the cell 130, the signal goes to the fourth metal layer, i.e. the top metal layer, from the output terminal of the cell through the via structure. Then the signal goes to the input terminal of next circuit, such as the cell 140, through the via structure. At this moment, the spare cell 120 is not used.

When ECO is performed for replacing the spare cell 120 for the cell 130, a plurality of photo masks should be revised for generating the circuit shown in FIG. 1B. FIG. 1B is a drawing showing a connection structure with the replacement by a spare cell. The via 150 is removed for cutting the electrical connection between the cells 130 and 140. In addition, the via 155 is added and the conductive wire 156 extends coupling the via 155. In the third metal layer, a conductive wire 152 is added between the terminal pad 151 and 153 so that the signal to be processed goes to the input terminal of the spare cell 120 from the conductive wire 101 through the via structure. After the signal is processed by the spare cell 120, the signal goes to the conductive wire 156 of the fourth metal layer from the output terminal of the cell through the via structure. Then the signal goes to the input terminal of next circuit, such as the cell 140, through the via structure.

Accordingly, the prior art ECO should revise a plurality of photo masks. The design cost is thus increased. When Fiber Ion Beam (FIB) debug is performed, the signal should be transferred to the top layer. Therefore, a plurality of masks should be revised in accordance with the prior art technology. The layout design of the prior art spare cell is not convenient to perform FIB debug and therefore expensive.

SUMMARY OF THE INVENTION

Therefore, the present invention is directed to an integrated circuit adapted for ECO and FIB debug. The layout of the spare cell according to an embodiment of the present invention allows the FIB debug and the ECO to be performed at a lower cost.

The present invention discloses an integrated circuit adapted for Engineering Change Order (ECO) and Fiber Ion Beam (FIB) debug, comprising: a substrate, a spare cell, a top-layer output terminal pad and a top-layer input terminal pad. The spare cell is disposed in the substrate and comprises at least one input terminal and at least one output terminal. The top-layer output terminal pad and the top-layer input terminal pad are disposed in a top metal layer. The top metal layer is disposed over the substrate. The top-layer output terminal pad and the top-layer input terminal pad are electrically coupled to the output terminal and the input terminal of the spare cell by a via structure, respectively.

According to an embodiment of the present invention, the spare cell has a preset logic function, adapted for ECO and FIB debug.

According to an embodiment of the present invention, the top-layer input terminal pad is electrically coupled to a ground voltage or a system power voltage by the via structure.

According to an embodiment of the present invention, when the FIB debug is performed, the top-layer input terminal pad and the top-layer output terminal are coupled to an output terminal of a previous-stage circuit and an input terminal of a next-stage circuit respectively for enabling the spare cell.

According to an embodiment of the present invention, at least one inter-medium metal layer is disposed between the top metal layer and the substrate. The via structure further comprises an inter-medium metal terminal pad on the inter-medium metal layer. The inter-medium metal terminal pads of the via structure is coupled to the output terminal, the input terminal and the system power voltage are an inter-medium output terminal pad, an inter-medium input terminal pad and an inter-medium system power voltage terminal pad, respectively. The present invention can perform ECO for any one of metal layers without revising the others. When the ECO is performed, for example, the inter-medium system power voltage terminal pad is removed to cut an electrical connection between the top-layer input terminal pad and the system power voltage; and the inter-medium input terminal and the inter-medium output terminal are coupled to an inter-medium metal previous-stage circuit and an inter-medium metal next-stage circuit for enabling the spare cell. Or a top system power voltage terminal pad is removed to cut an electrical connection between the top-layer input terminal pad and the system power voltage; and the top-layer input terminal pad and the top-layer output terminal are coupled to a top-metal layer previous-stage circuit and a top-metal layer next-stage circuit respectively for enabling the spare cell.

The present invention couples the input terminal and the output terminal of the spare cell to the top metal layer (conductive layer) by the via structure. Therefore, it is adapted for FIB process. Moreover, the input terminal and the output terminal of the spare cell of the present invention have the terminal pads between the metal layers. Accordingly, only one metal layer is required to be revised for enabling the spare cell. The design cost can be reduced. Therefore, the layout of the spare cell of the integrated circuit of the present invention is adapted for requirements of FIB and ECO.

In order to make the aforementioned and other objects, features and advantages of the present invention understandable, a preferred embodiment accompanied with figures is described in detail below.

DESCRIPTION OF THE EMBODIMENTS

Following are the descriptions for a preferred integrated circuit with, for example, four metal layers. It means the top metal is the fourth metal layer. Additionally, the integrated circuit of the embodiment can be, for example, a Complementary Metal-Oxide-Semiconductor (CMOS) integrated circuit. The elements in this embodiment are for exemplary. One of ordinary skill in the art can know and modify the circuit in accordance with the present invention. Therefore, the scope of the present invention is not limited thereto.

Figure 1A:
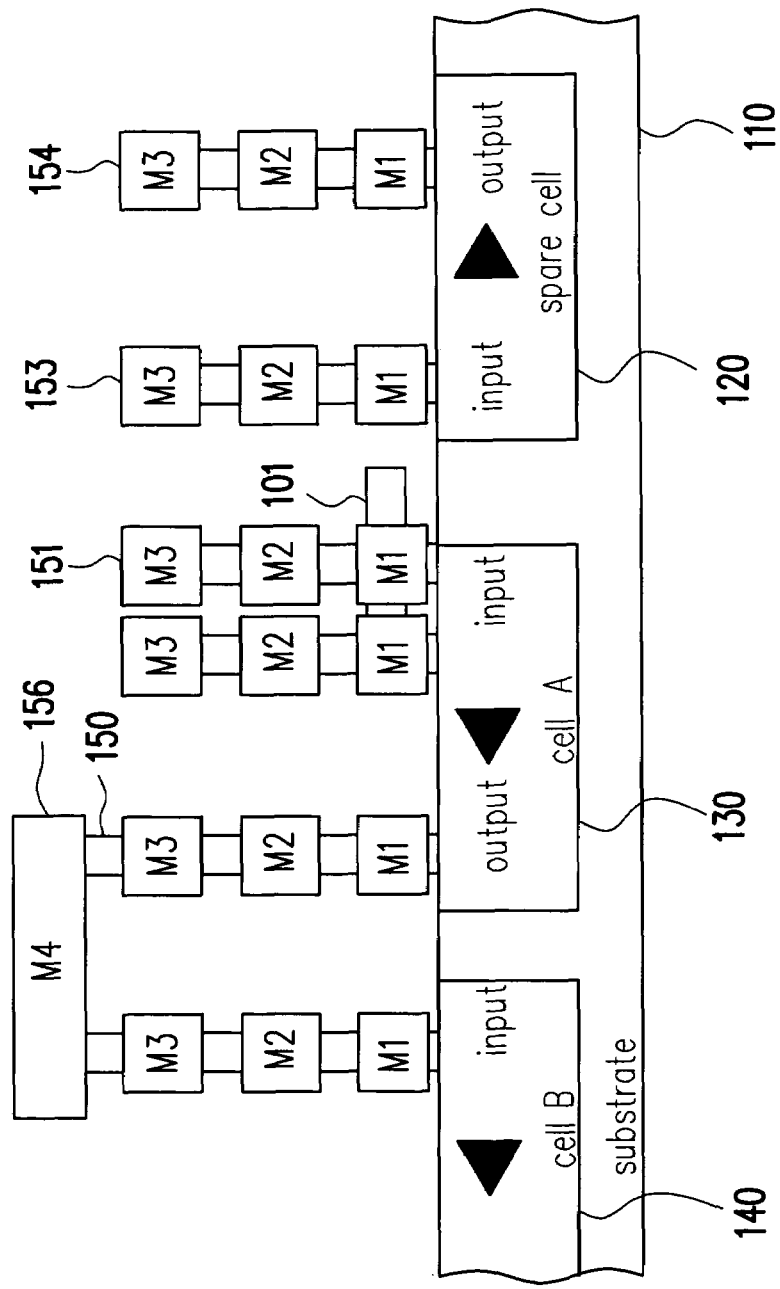
FIG. 1A is a drawing showing a-prior art spare cell of an integrated circuit.
Figure 1B:
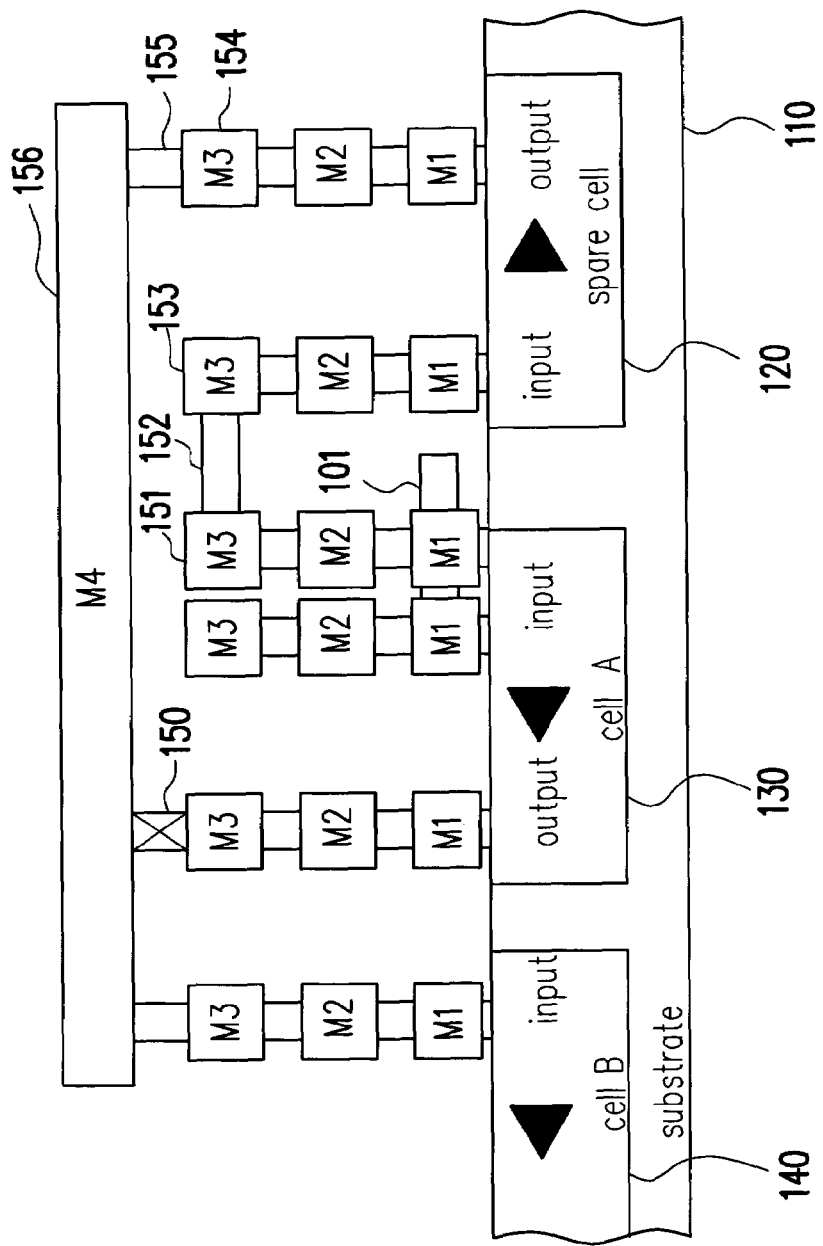
FIG. 1B is a drawing showing a connection structure with the replacement by a spare cell.
Figure 2:
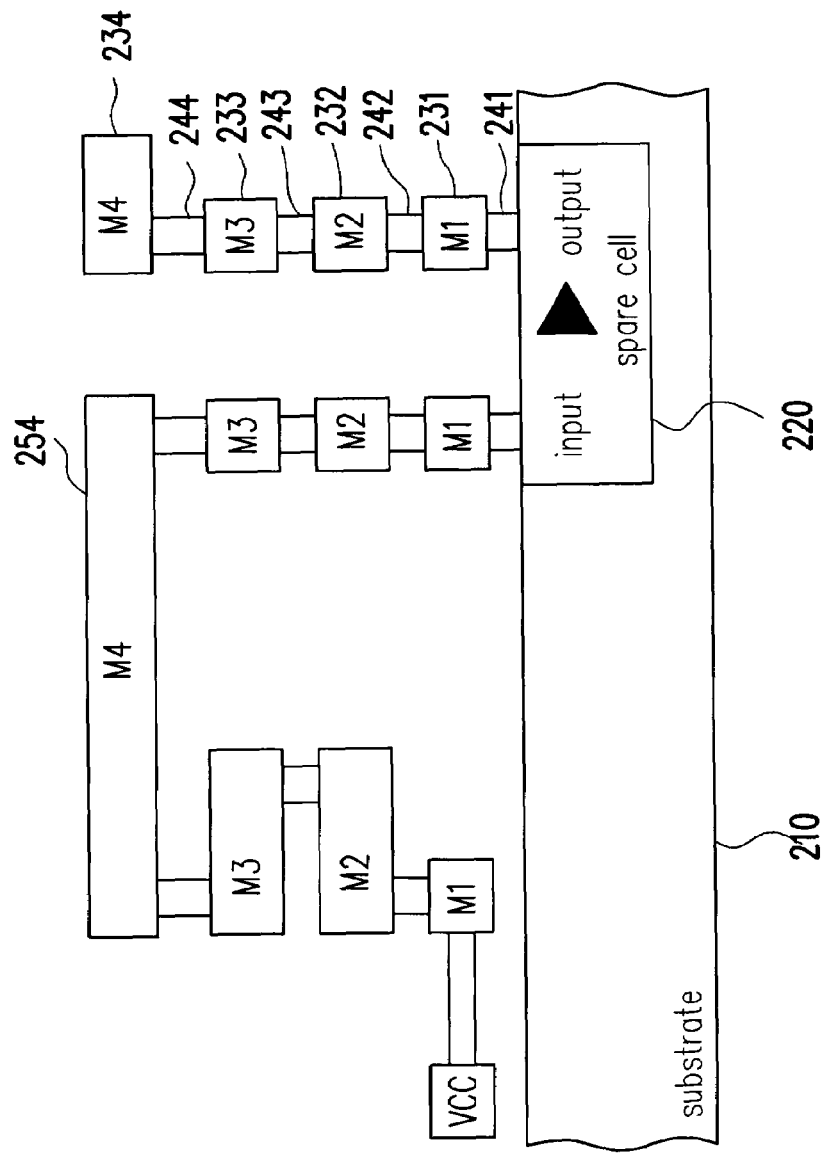
FIG. 2 is a cross-sectional view showing an integrated circuit adapted for ECO and FIB debug in accordance with an embodiment of the present invention.

FIG. 2 is a cross-sectional view showing an integrated circuit adapted for ECO and FIB debug in accordance with an embodiment of the present invention. Referring to FIG. 2, a spare cell 220 is formed in a substrate 210. The spare cell 220 has a preset electrical function or logic function, such as a NOT gate. The spare cell 220 comprises at least one input terminal and at least one output terminal. The input terminal and the output terminal are coupled to the top metal layer by the via structure. In this embodiment, the top metal layer is, for example, the fourth metal layer M4.

In this embodiment, the via structure means a structure to electrically connect two metal layers by vias. For example, the via structure coupled to the output terminal of the spare cell 220 comprises a first terminal pad 231, a second terminal pad 232, a third terminal pad 233 and a fourth terminal pad (the top layer) 234. The output terminal of the spare cell 220, the terminal pads 231, 232, 233, and 234 are electrically coupled by the vias 241, 242, 243, and 244, respectively. Because the spare cell 220 is prepared for circuit or debug, the input terminal cannot be floating. In this embodiment, because the spare cell 220 is, for example, a CMOS circuit, the input terminal cannot be floating. The input terminal should be coupled to the top-layer terminal pad/conductive wire 254, and to the system power voltage VCC or ground voltage (not shown). The system power voltage VCC of the cell usually is disposed in the first metal layer M1. Therefore, the top-layer terminal pad/conductive wire 254 is coupled to the system power voltage VCC by the via structure.

Figure 2A:
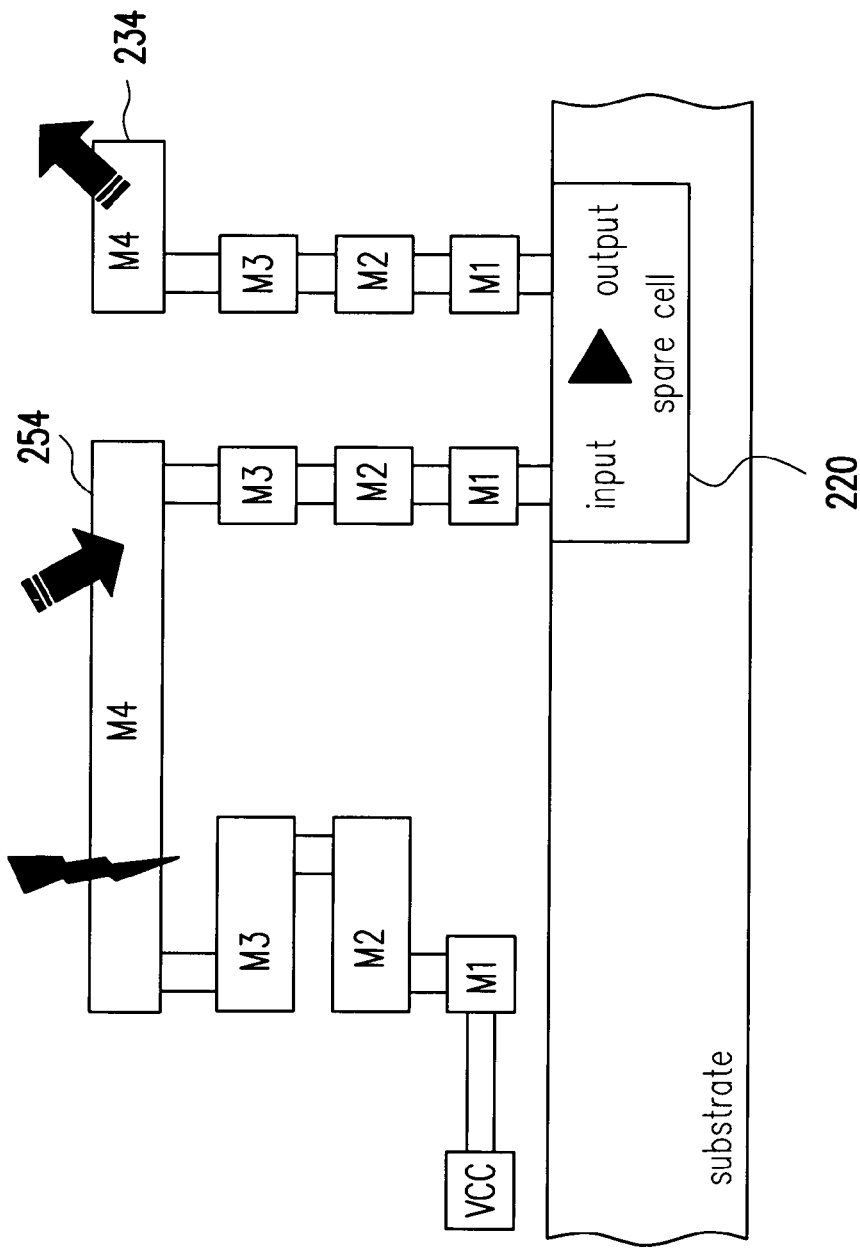
FIG. 2A is a drawing showing an exemplary FIB debug for the integrated circuit in accordance with the present invention.

FIG. 2A is a drawing showing an exemplary FIB debug for the integrated circuit in accordance with the present invention. Referring to FIG. 2A, in order to enable the spare cell 220 by the FIB debug, an ion beam is used to cut the terminal pad/conductive wire 254 for disconnecting the input terminal of the spare cell 220 and the system power voltage VCC. Then, the terminal pad 254 and the terminal pad 234 are coupled to a previous-stage circuit (not shown) and a next-stage circuit (not shown) respectively for enabling the spare cell 220.

Figure 2B:
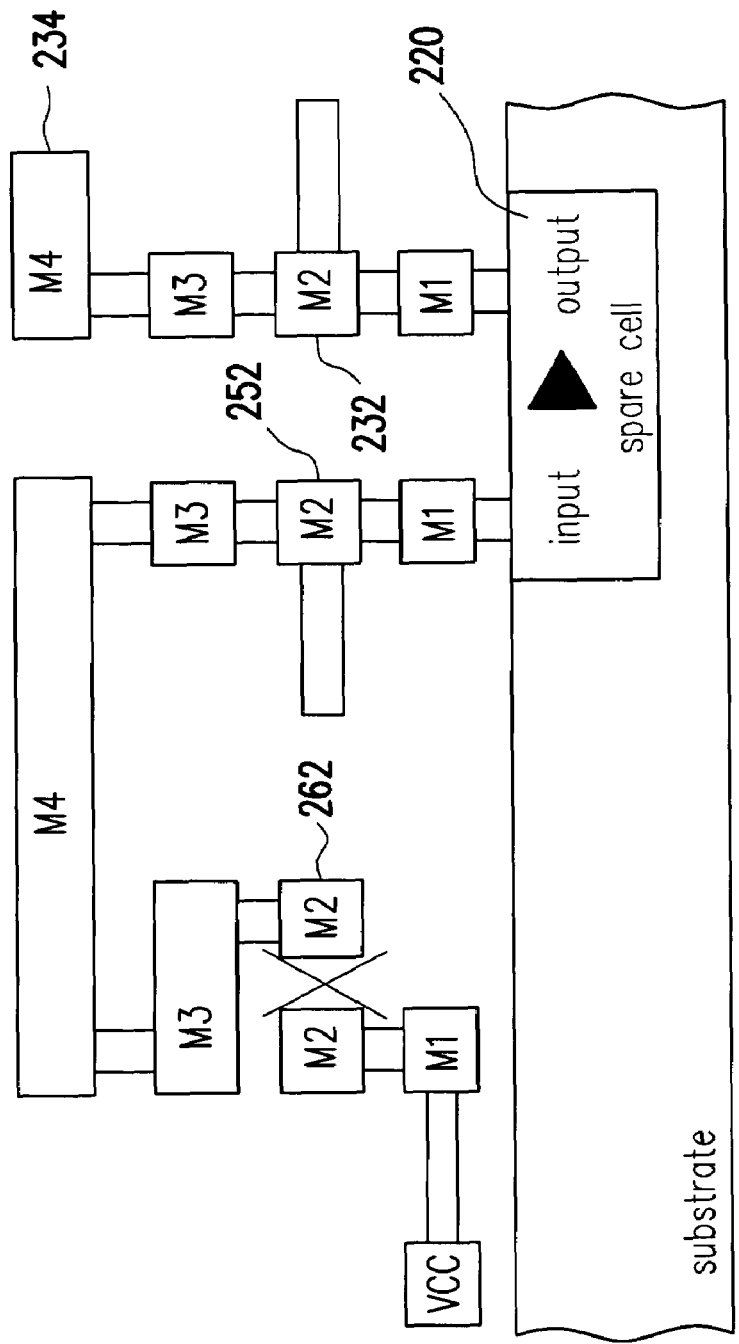
FIG. 2B is a drawing showing an exemplary ECO for the integrated circuit in accordance with the present invention.

When ECO is to be performed, only one metal photo mask layer should be revised to enable the cell 220. Following are the descriptions based on an example of changing the second metal layer M2 to enable the spare cell 220. FIG. 2B is a drawing showing an exemplary ECO for the integrated circuit according to an embodiment of the present invention. Referring to FIG. 2B, the photo mask of the second metal layer M2 is revised to cut the terminal pad 262 for disconnecting the input terminal 220 of the spare cell and the system power voltage VCC. In addition, additional conductive wires are formed by revising the second metal layer M2 photo mask. The terminal pad 252 and the terminal pad 253 are coupled to the previous-stage circuit (not shown) and a next-stage circuit (not shown) for enabling the spare cell 220. By the revision of the second metal layer M2 photo mask without of the others, the spare cell 220 can be enabled. Therefore, the design cost can be reduced.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. An integrated circuit adapted for Engineering Change Order (ECO) and Fiber Ion Beam (FIB) debug, comprising:
    a substrate;
    a spare cell, disposed in the substrate, the spare cell comprising at least one input terminal and at least one output terminal;
    a plurality of metal layers, disposed over a surface of the substrate;
    a top-layer output terminal pad, disposed in a top metal layer of the plurality of metal layers and electrically coupled to the output terminal of the spare cell by a via structure; and
    a top-layer input terminal pad, disposed in the top metal layer and electrically coupled to the input terminal of the spare cell by the via structure.

2. The integrated circuit adapted for Engineering Change Order (ECO) and Fiber Ion Beam (FIB) debug of claim 1, wherein the spare cell has a preset logic function, adapted for ECO and FIB debug.

3. The integrated circuit adapted for Engineering Change Order (ECO) and Fiber Ion Beam (FIB) debug of claim 1, wherein when the FIB debug is performed, the top-layer input terminal pad and the top-layer output terminal are coupled to an output terminal of a previous-stage circuit and an input terminal of a next-stage circuit respectively for enabling the spare cell.

4. The integrated circuit adapted for Engineering Change Order (ECO) and Fiber Ion Beam (FIB) debug of claim 1, wherein when the ECO is performed, the top-layer input terminal pad and the top-layer output terminal are coupled to a top-metal layer previous-stage circuit and a top-metal layer next-stage circuit respectively for enabling the spare cell.

5. The integrated circuit adapted for Engineering Change Order (ECO) and Fiber Ion Beam (FIB) debug of claim 1, wherein at least one inter-medium metal layer is disposed between the top metal layer and the substrate; the via structure further comprises an inter-medium metal terminal pad on the inter-medium metal layer; the inter-medium metal terminal pads of the via structure coupled to the output terminal and the input terminal are an inter-medium output terminal pad and an inter-medium input terminal pad, respectively; and when the ECO is performed, the inter-medium input terminal and the inter-medium output terminal are coupled to an inter-medium metal previous-stage circuit and an inter-medium metal next-stage circuit for enabling the spare cell.

6. The integrated circuit adapted for Engineering Change Order (ECO) and Fiber Ion Beam (FIB) debug of claim 1, wherein the top-layer input terminal pad is coupled to a ground voltage by the via structure.

7. The integrated circuit adapted for Engineering Change Order (ECO) and Fiber Ion Beam (FIB) debug of claim 1, wherein the top-layer input terminal pad is coupled to a system power voltage by the via structure.

8. The integrated circuit adapted for Engineering Change Order (ECO) and Fiber Ion Beam (FIB) debug of claim 7, wherein when the FIB debug is performed, an ion beam is used to cut an electrical connection between the top-layer input terminal pad and the system power voltage; and the top-layer input terminal pad and the top-layer output terminal pad are coupled to an output terminal of a previous-stage circuit and an input terminal of a next-stage circuit respectively for enabling the spare cell.

9. The integrated circuit adapted for Engineering Change Order (ECO) and Fiber Ion Beam (FIB) debug of claim 7, wherein when the ECO is performed, a top system power voltage terminal pad is removed to cut an electrical connection between the top-layer input terminal pad and the system power voltage; and the top-layer input terminal pad and the top-layer output terminal are coupled to a top-metal layer previous-stage circuit and a top-metal layer next-stage circuit respectively for enabling the spare cell.

10. The integrated circuit adapted for Engineering Change Order (ECO) and Fiber Ion Beam (FIB) debug of claim 7, wherein at least one inter-medium metal layer is disposed between the top metal layer and the substrate; the via structure further comprises an inter-medium metal terminal pad on the inter-medium metal layer; the inter-medium metal terminal pads of the via structure coupled to the output terminal, the input terminal and the system power voltage are an inter-medium output terminal pad, an inter-medium input terminal pad and an inter-medium system power voltage terminal pad, respectively; when the ECO is performed, the inter-medium system power voltage terminal pad is removed to cut an electrical connection between the top-layer input terminal pad and the system power voltage; and the inter-medium input terminal and the inter-medium output terminal are coupled to an inter-medium metal previous-stage circuit and an inter-medium metal next-stage circuit for enabling the spare cell.

11. The integrated circuit adapted for Engineering Change Order (ECO) and Fiber Ion Beam (FIB) debug of claim 7, wherein the integrated circuit is a Complementary Metal-Oxide-Semiconductor (CMOS) integrated circuit.

* * * * *